United States Patent [19]

Bunshah et al.

[11] Patent Number: 5,055,319
[45] Date of Patent: Oct. 8, 1991

[54] CONTROLLED HIGH RATE DEPOSITION OF METAL OXIDE FILMS

[75] Inventors: Rointan F. Bunshah, Playa del Rey; Chandra V. Deshpandey, Los Angeles; Hans J. Doerr, Westlake Village; Jong S. Yoon, Northridge, all of Calif.

[73] Assignee: The Regents of the University of California, Oakland, Calif.

[21] Appl. No.: 503,298

[22] Filed: Apr. 2, 1990

[51] Int. Cl.$^5$ .............................................. B05D 3/06
[52] U.S. Cl. ....................................... 427/38; 427/42; 427/50; 427/255; 427/255.3; 427/294; 427/295; 427/314; 427/319
[58] Field of Search ....................... 427/35, 42, 38, 50, 427/255.3, 255, 294, 295, 314, 319

[56] References Cited

U.S. PATENT DOCUMENTS 4,767,666  8/1988  Bunshah et al. ..................... 428/334

OTHER PUBLICATIONS

"Alumina Deposition by Activated Reactive Evaporation", R. F. Bunshah and R. J. Schramm, Thin Solid Films, 40 (1977) 211–216.

"Synthesis and Characterization of Yttrium Oxide ($Y_2O_3$) Deposits", M. Colen and R. F. Bunshah, J. Vac. Sci. Technol., vol. 13, No. 1, Jan./Feb. 1976, pp. 536–539.

"Reactive High Rate D.C. Sputtering of Oxides", M. Scherer and P. Wirz, Thin Solid Films, 119 (1984), 203–209.

"Synthesis of Various Oxides in the Ti–O System by Reactive Evaporation and Activated Reactive Evaporation Techniques", W. Grossklaus and R. F. Bunshah, J. Vac. Sci. Technol., vol. 12, No. 1, Jan./Feb. 1975, pp. 593–597.

"Processing Science and the Technology of High $T_c$ Films", R. F. Bunshah and C. V. Deshpandey, Res. & Dev., Jan. 1989, pp. 65–79.

"Ceramic Thin Films: Fabrication and Applications", M. Sayer and K. Sreenivas, Science, vol. 247, pp. 1056–1060.

Primary Examiner—Bernard Pianalto
Attorney, Agent, or Firm—Poms, Smith, Lande & Rose

[57] ABSTRACT

A process for depositing metal oxides by activated reactive evaporation (ARE) wherein deposition rate and film quality is controlled by reference to the relative amounts of metal and metal oxide present on the surface of the target material. The ratio of metal surface area to metal oxide surface area required to obtain high deposition rates is achieved by maintaining a relatively high concentration of oxygen in the reaction zone. This relative ratio of metal surface area to metal oxide surface area on target material provides a continuous indirect measure of film deposition rate and quality during the ARE process.

20 Claims, 2 Drawing Sheets

CONTROLLED HIGH RATE DEPOSITION OF METAL OXIDE FILMS

BACKGROUND OF THE INVENTION

1. Field of the Invention

The present invention relates generally to processes for depositing thin films of metal oxides onto a variety of substrates. More particularly, the present invention involves the fabrication of such metal oxide films with high deposition rates using the activated reactive evaporation (ARE) technique.

2. Description of Related Art

A wide variety of simple evaporation processes have been used to deposit thin films of materials on various substrates. In these processes, vapors are produces from a source material by the application of heat or other energy source. The vapors produced from the source are then condensed onto a substrate. One problem experienced with such simple evaporation involves partial dissociation of the compounds during evaporation which results in less than full stoichiometry. This causes the formation of films which are dificient in one or more elements and therefore non-stoichiometric. Another problem involves those compounds which have a high melting point. A very high power density is required in order to obtain appreciable evaporation rates of these compounds. The application of such high power densities to billets fabricated by powder metallurgy methods may result in disintegration of the billet.

In response to the above problems, the process of reactive evaporation (RE) was developed. In reactive evaporation, metal atoms are evaporated from a thermally heated source in a vacuum chamber in the presence of a partial-pressure reactive gas, such as oxygen. The reactive gas and metal atoms react to form compounds which are deposited on the substrate. A modified form of reactive evaporation was developed in 1972 by R. F. Bunshah and A. C. Raghurham (J. Vac. Sci. Technol. 9, 1385 (1972)). The modified process involves introduction of a plasma between the evaporant source and the substrate. This modified evaporation process is commonly referred to as activated reactive evaporation (ARE). An advantage of ARE is that it enhances the probability of reactions taking place by activating or partially ionizing the evaporant atoms. In view of this advantage of the ARE technique, it would be desirable to extend the process to deposit high quality $Al_2O_3$ films at very high deposition rates.

In any process for forming films on a substrate, it is desirable to maximize deposition rates while not adversely affecting film quality or compound stoichiometry. This is particularly true for aluminum oxide films, which are used in many high technology applications. For example, aluminum oxide films have played an important role in various fields as an insulating layer in metal-insulator-semiconductor field effect transistor (MISFET), gate insulators in solid state hydrogen sensors, X-ray and accelerator neutralizers in nuclear reactors, tunnel barriers in Josephson tunnel junctions, antireflection coatings in solar cells, optical wave guides and protective layers for metal reflectors. In view of these applications, a variety of techniques have been used to synthesize $Al_2O_3$ films. For example, techniques such as chemical vapor deposition (CVD), metal organic chemical vapor deposition (MOCVD), glow discharge, electron beam evaporation of alumina, rf sputter deposition, reactive sputter deposition, ion beam sputter deposition and recently molecular layer epitaxy (MLE) have been used to synthesize aluminum oxide films.

Aluminum oxide films have been prepared by chemical vapor deposition utilizing aluminum chloride as the major reactant (S. K. Tung and R. E. Caffrey, Tran. Metall. Soc. AIME, 233 (1965) 572; A. S. Wong, G. M. Michal and I. E. Locci, J. Mater. Res., 3(5) (1988) 572). In this technique, a uniform deposit of aluminum oxide was produced by pyrohydrolizing aluminum chloride with hydrogen and carbon dioxide gas at approximately 850° C. Aluminum oxide films have also been fabricated at lower substrate temperatures utilizing metal organic chemical vapor deposition techniques (J. Fournier, W. DeSisto, R. Brusasco, M. Sosnowski, R. Kershaw, J. Baglio, K. Dwight and A. Wold, Mat. Res. Bull., 23 (1988) 31; C. Dhanavantri and R. N. Karekar, Thin Solid Films, 169 (1989) 271). In these MOCVD processes, volatilized aluminum isoperoxide was thermally decomposed at substrate temperatures of between 350° C. and 500° C. to deposit the aluminum oxide films. In another technique, a plasma was employed to enhance the CVD process (Y. Catherine and A. Talebian, J. Electrochem. Soc., 17(2) (1988) 127). The plasma was produced by means of either a 450 kHz or 13.56 MHz discharge. A mixture composed of $Al(CH_3)_3$(TMA) with helium or argon as the carrier gas and $CO_2$ was used as the reactant. The aluminum oxide films were prepared at substrate temperatures between 25° C. and 350° C.

High quality aluminum oxide films have also been prepared by evaporating aluminum oxide pellets in an environment of oxygen gas at substrate temperatures ranging from 25° C. to 250° C. (J. Saraie, S. Goto, Y. Kitao and Y. Yodoggawa, J. Electrochem. Soc. 134 (1987) 2805). Radio frequency sputter deposition and reactive sputter deposition have also been employed to produce aluminum films using aluminum oxide and aluminum metal targets, respectively. The ion beam sputter deposition technique utilized to deposit aluminum oxide films has used ionized argon gas which was accelerated and directed to the aluminum oxide target by an accelerator grid. The target material was sputtered off with oxygen gas being introduced to compensate for the partial dissociation of aluminum oxide during the sputtering process (C. Nishimura, K. Yanagisawa, A. Tago and T. Toshima, J. Vac. Sci. Technol., A5(3) (1987) 343; S. M. Arnold and B. E. Cole, Thin Solid Films, 165 (1988) 1).

With respect to molecular layer epitaxy, single crystals of alpha-aluminum oxide films have been produced (G. Oya, M. Yoshida and Y. Sawada, Appl. Phys. Lett., 51(15) (1987) 1143). In the MLE technique, an anhydrous aluminum chloride vapor and a helium/oxygen gas mixture were alternatively supplied to the substrate through separate pipes by opening and closing valves attached to the pipes. Aluminum oxide has been deposited by activated reactive evaporation wherein a one inch diameter billet of aluminum metal was evaporated from a rod-fed electron beam source in the presence of partial pressures of oxygen varying from $2 \times 10^{-5}$ Torr to $2 \times 10^{-4}$ Torr (R. F. Bunshah and R. J. Schramm, Thin Solids Film, 40 (1977) pp. 211-216).

Although high quality aluminum oxide films have been synthesized utilizing the above described techniques, the deposition rates obtained have been relatively low. For example, deposition rates of 4.6 to 33.9 nm per minute for MOCVD and 18 nm per minute for electron beam evaporation of aluminum oxide have been reported. Deposition rates for techniques such as ion beam sputter deposition and glow discharge are typically below 15 nm per minute. Aluminum oxide deposition rates as high as 90 nm per minute have been obtained using modified ion source geometry in an ion beam sputter deposition technique. Deposition rates for ARE have typically been well below 200 nm per minute.

An obstacle to increasing deposition rates of metal oxides, such as aluminum oxide, by the ARE technique is oxide poisoning of the metal billet or target material (i.e., formation of an oxide layer on top of the molten aluminum). Metal oxides, such as aluminum oxide, have a melting point which is much higher than the melting point of the metal. Accordingly, if a layer of aluminum oxide is allowed to form, the evaporation of metal from the source material is adversely affected. In the ARE technique, the oxygen which is introduced into the system to react with vaporized metal also tends to react with metal present on the billet surface. This leads to reduction of the deposition rate because of the lower evaporation rate of aluminum oxide as compared to pure aluminum. An increase in deposition rate can be achieved by increasing the electron beam current. However, this leads to deposition of substoichiometric metal rich films.

There is a continuing need to develop and define process conditions for the deposition of metal oxides by ARE wherein the deposition rate is increased without sacrificing film quality. It would be desirable to provide a process for depositing metal oxide films by ARE wherein fully stoichiometric, transparent films of metal oxides are deposited at rates on the order of 10 to 20 $\mu$m/hour or higher.

SUMMARY OF THE INVENTION

In accordance with the present invention, a process is provided to deposit stoichiometric films of metal oxides at relatively high rates. The present invention is based on the discovery that deposition rates of aluminum oxides on the order of 10 to 20 $\mu$m/hour and higher can be obtained utilizing activated reactive evaporation when the poisoning of the target material is controlled within certain parameters.

The present invention involves an activated reactive evaporation process for depositing metal oxide films onto a wide variety of substrates. The process involves conventional ARE wherein a substrate is supported in a vacuum system and a source of metal having an exposed surface displaced away from the substrate is evaporated by heating. The evaporated metal forms a metal vapor in a zone located between the substrate and the metal target. An oxygen-containing gas is introduced into the zone where it mixes with the metal vapor to form a mixture of metal vapor and oxygen. The introduced oxygen also reacts with metal present in the target material to form one or more oxides of the metal on the target surface. The mixture of metal vapor and oxygen is energized with sufficient energy to form a plasma from which metal oxide is deposited onto the substrate.

As a feature of the present invention, the amount of oxygen introduced into the zone is controlled to achieve a ratio of metal surface area on the target to metal oxide surface area which has been previously determined to provide rapid deposition of metal oxide on the substrate. It was discovered that the amount of oxygen required to achieve the desired ratio of metal surface area to metal oxide surface area on the target was surprisingly high in view of known problems with respect to oxide poisoning of targets. It was found that high deposition rates could be achieved, in spite of high oxygen levels, provided that the ratio of metal surface area to metal oxide surface area on the target was controlled to achieve the preselected ratio of metal surface area to metal oxide surface area.

As another feature of the present invention, it was discovered that the ratio of metal surface area to metal oxide surface area on the metal target surface should correspond to the stoichiometric ratio of elements being deposited. For example, when depositing aluminum oxide films, the ratio of metal surface area to metal oxide surface area in accordance with the present invention should be about 2:3. In addition, the optimum relative ratio of metal surface area to metal oxide surface area can be determined experimentally by establishing the optimum deposition rate by varying the ratio of metal surface area to metal oxide surface area on the target and observing changes in deposition rate and film quality.

The deposition process in accordance with the present invention allows one to obtain deposition rates on the order of 10 to 20 $\mu$m/hour and higher for many different metal oxides utilizing the well known ARE technique. Further, these high deposition rates can be controlled and reproducibly obtained based upon reference to the ratio of metal surface area to metal oxide surface area as discussed in detail below.

The above described and many other features and attendant advantages of the present invention will become better understood by reference to the following detailed description when taken in conjunction with the accompanying drawings.

DETAILED DESCRIPTION OF THE INVENTION

The present invention may be used in a variety of activated reactive evaporation processes (ARE) to deposit metal oxides on substrates. The ARE process is disclosed in U.S. Pat. No. 3,791,852, the contents of which are hereby incorporated by reference. The metal oxides which may be deposited in accordance with the present invention include aluminum oxide, titanium oxide, yttrium oxide, zirconium oxide, tantalum oxide, vanadium oxide, tungsten oxide, niobium oxide and ruthenium oxide. The process is especially well suited for depositing metal oxides wherein the metal has a high thermal conductivity. The following description of a preferred exemplary embodiment will be limited to the deposition of aluminum oxide films with it being understood that the present invention is not limited to deposition of this particular metal oxide.

Figure 1:
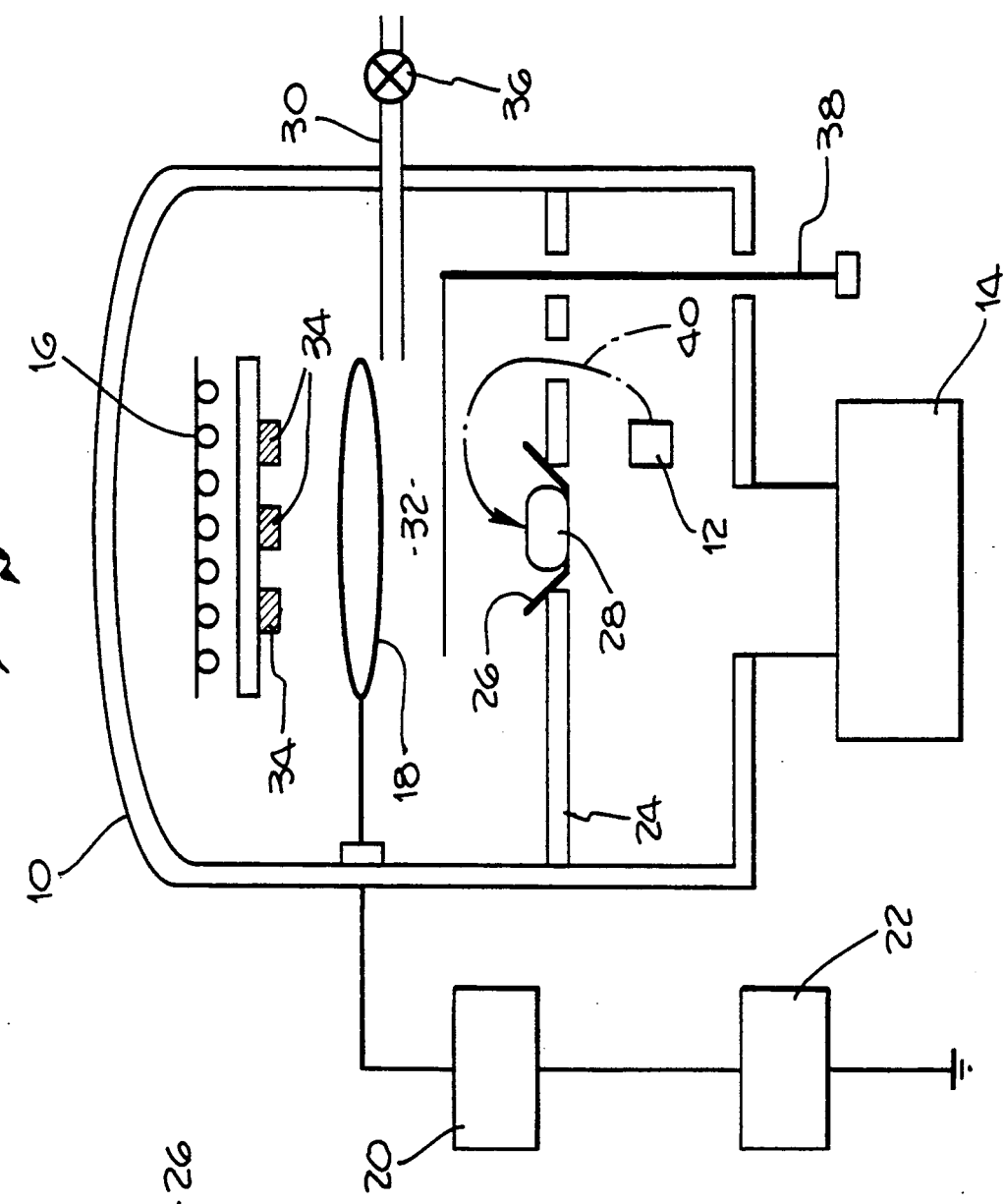
FIG. 1 is a diagrammatic representation of an activated reactive evaporation system for use in carrying out a preferred exemplary process in accordance with the present invention.

The apparatus which is used to carry out the process of the present invention is a conventional ARE apparatus as shown diagrammatically in FIG. 1. The ARE apparatus includes a vacuum chamber 10, an electron beam evaporating gun 12, a vacuum pump 14, a heating lamp or element 16, and a radio frequency antenna 18, which is powered by a radio frequency power unit 20 which is powered by a power supply 22. The vacuum chamber 10 is preferably a water-cooled stainless steel bell jar which is divided into two sections by a stainless steel pressure barrier or plate 24. The electron beam gun 12 is located in the lower section of the vacuum chamber below plate 24 where the pressure is maintained at less than $10^{-3}$ Torr to avoid arcing. The electron beam gun 12 is preferably a self-accelerated 270° deflection type, such as Airco Temescal model SFIH-200-2. The power supply for the electron gun 12 is preferably an Airco Temescal model CV14 unit which may be operated at a constant voltage, such as 10 kv, with a variable emission current.

The aluminum metal which is to be evaporated is placed in a water-cooled copper hearth 26 which has a diameter of approximately two inches. A rod feed-type configuration can also be used for continuous operation if desired. However, use of the water-cooled copper hearth is preferred. The aluminum metal is placed in the copper hearth 26 as an ingot 28 which is preferably of high purity, i.e., 99.999% pure. The low pressures necessary to carry out ARE in the vacuum chamber 10 are maintained by the vacuum pump 14 which is preferably a fractionating diffusion pump with an anti-migration-type liquid nitrogen trap.

In order to form the plasma required in ARE deposition processes, oxygen or an oxygen-containing gas is introduced through inlet 30 into the zone 32 located between the aluminum target 28 and substrate 34. Introduction of oxygen into the chamber through inlet 30 is controlled by a valve 36. The radio frequency antenna 18 used to excite the plasma formed by the evaporated aluminum metal and oxygen is preferably an inductively-coupled stainless steel circular coil which is powered by a conventional 13.56 MHz radio frequency supply such as Bendix model AST350 via an L-type matching network or radio frequency unit 20. The antenna 18 may also be energized by direct current or electron-cyclotron-resonance (ECR).

The aluminum oxide may be deposited on a wide variety of substrates 34 including glass, quartz, molybdenum, stainless steel, silicon, sapphire and the like. A wide variety of substrate sizes and shapes may also be used, provided that they are amenable to conventional ARE deposition. The substrate temperature can be between room temperature and 1000° C.

A shutter 38 is provided between the aluminum target 28 and the substrate 34. The shutter is operable between open and closed positions as is conventionally known to allow control of the migration of evaporated metal from the target 28 toward the substrate 34.

The ARE process is carried out by evacuating the vacuum chamber 10 down to a base pressure of about $10^{-6}$ Torr utilizing vacuum pump 14. The electron beam gun 12 is then used to irradiate the aluminum ingot or target 28, as represented by arrow 40, to form a pool of molten aluminum metal on the target material surface from which aluminum metal is evaporated. Upon opening of shutter 38, the evaporated aluminum metal migrates into the zone 32 where it is mixed with oxygen which has been introduced through inlet 30. The resulting mixture of evaporated metal and oxygen is activated by the radio frequency antenna 18 to form a plasma from which aluminum oxide is deposited onto substrate 34.

Figure 2:
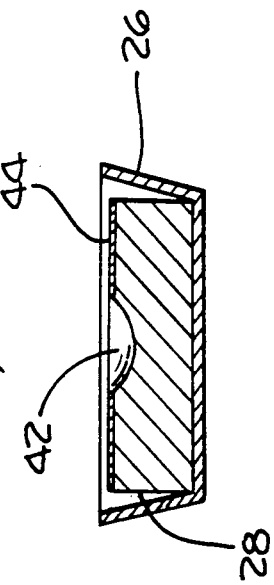
FIG. 2 is a side sectional view of an aluminum metal billet during the ARE process which depicts a preferred ratio of aluminum metal surface area to aluminum oxide surface area.
Figure 3:
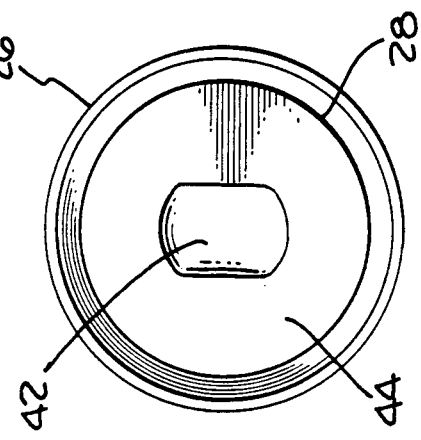
FIG. 3 is a top view of the aluminum billet shown in FIG. 2.

During the ARE process, oxygen comes in contact with the aluminum target 28 and reacts with the aluminum metal to form aluminum oxide. Aluminum oxide has a melting point which is much higher than that of aluminum metal. Accordingly, the evaporation of aluminum metal from the target 28 in the area covered by aluminum oxide is reduced. A detailed view of the aluminum target material 28 during the ARE process is shown in FIGS. 2 and 3. During activated reactive evaporation, a pool of molten aluminum 42 is formed on the surface of the target. The remainder of the surface 44 is covered with a layer of aluminum oxide.

In accordance with the present invention, it was discovered that the relative ratio of surface area covered by the molten metal 42 as opposed to the aluminum oxide layer 44 has a direct effect and relationship to the rate of deposition of metal oxide onto the substrate 34. It was further found that the size of the molten metal pool 42 could be controlled by varying the oxygen flow into the chamber 10. The amount of oxygen introduced into the chamber 10 is controlled to achieve a ratio of the molten metal surface area 42 to metal oxide surface area 44 which results in maximum deposition rates of acceptable quality aluminum oxide films. The preferred ratio of molten metal surface 42 to metal oxide surface area 44 is approximately 2:3 for aluminum oxide. For other metals, the relative ratio of metal surface area to metal oxide surface area is close to the stoichiometric ratios. However, the actual ratio of molten metal surface area 42 to metal oxide surface area 44 which provides optimum deposition characteristics can be established easily by experimentation.

Conventional vacuum chambers have windows through which the surface of the target material is visible. Accordingly, the relative surface areas covered by the molten metal and metal oxide can be easily measured, monitored and controlled. Once the electron beam current is above a threshold value, for example 350 mA, the ratio of pure metal to metal oxide on the target surface is conveniently controlled by varying the amount of oxygen introduced into the vacuum chamber 10. The oxygen rate can then be varied to change the ratio of metal surface area to metal oxide surface area. In this way, the optimum deposition rate and film quality can be correlated to the ratio of metal to metal oxide surface area.

It is preferred that the oxygen be initially controlled to achieve a ratio of metal surface area to metal oxide surface area which approximately corresponds to the stoichiometric ratio of metal to oxide in the deposited metal oxide. The oxygen flow into the chamber can then be increased or decreased slightly with changes in rate of deposition and deposition film characteristics being compared to changes in the surface area of the target covered by metal and metal oxide. Once the desired deposition rate and deposition film characteristics are achieved, the ratio of metal surface area to metal oxide surface area on the target remains constant. Once this ratio has been determined, it may be used in subsequent ARE processes as a preselected or predetermined ratio which is achieved in order to reproducibly obtain high deposition rates for aluminum oxide films having acceptable characteristics.

Once the system is in operation, the ratio of metal surface area to metal oxide surface area is monitored during the process via partial pressure of oxygen gas to ensure that the deposition rate does not change or that the character of the depositing species also does not change. In effect, this provides an indirect means for monitoring deposition rate and film quality on the substrate.

In accordance with the present invention, it was discovered that in order to obtain ratios of metal surface area to metal oxide surface area on the target which provided high deposition rates, the oxygen level in the vacuum chamber must be raised to levels which are relatively high. Oxygen levels on the order of 1 mTorr to about 5 mTorr are typically used to achieve the desired ratio of metal surface area to metal oxide surface area on the target material. Further, the overall chamber pressure was found to determine stoichiometry of the aluminum oxide film. When the chamber pressure is kept at over 5 mTorr, near stoichiometric aluminum oxide films are obtained which are not dependent on the electron beam current. It is believed that a semi-equilibrium condition is established on the billet under these conditions which results in the increased deposition rates which were observed.

Examples of practice are as follows:

EXAMPLE 1

The chamber 10 was pumped down to a base pressure of approximately $10^{-6}$ Torr before turning on the substrate heater 16. The substrate heater was then turned on. The substrate was a glass plate having the dimensions 25 mm×1 mm×75 mm. A high purity (99.999% pure) aluminum ingot was placed in the water-cooled copper hearth whose diameter was two inches. After the substrate reached a temperature of 300° C., the electron beam gun was turned on and the electron beam current was increased very slowly to clean the surface of the aluminum and degas the charge. The electron beam gun was the Airco Temescal model SFIH-200-2. The power supply for the electron beam gun was the Airco Temescal model CV14 unit which was operated at a constant voltage of 10 kv. A very thin layer of aluminum oxide was present on the aluminum ingot. This layer of oxide was ruptured and an elliptical molten pool was formed as the power increased. The metal pool surface area continuously increased until the electron beam current reached approximately 350 mA. Beyond this point, the pool area did not increase even though the power was increased up to 600 mA.

Oxygen gas was introduced into the chamber after the metal pool size reached a maximum surface area. A plasma was formed near the billet at this time. The inductively coupled radio frequency generator was operated at 13.56 MHz with radio frequency power gradually being increased to about 100 watts. The shutter was opened after a stable operating condition was obtained. Deposition of aluminum oxide films were performed for two hours at various oxygen pressures while the electron beam current was varied from 520 to 580 mA. Changes in deposition rates of the films ranged from 22 to 5.8 μm/hour as the oxygen pressure was changed from 1.5 mTorr to 5 mTorr (see FIG. 4).

As the oxygen pressure increased, the surface area of the molten pool of aluminum decreased. A relatively high deposition rate of 8 μm/hour was obtained with good film quality when the ratio of metal surface area to metal oxide surface area was approximately 1:2. Even higher deposition rates were obtained when the ratio of metal surface area to metal oxide surface area was 1:1. At a ratio of 2:3, the deposition rate was 12 μm/hour. It was found that the ratio of metal surface area to metal oxide surface area is determined by electron beam current, plasma intensity and partial pressure of the oxygen gas. When chamber pressure was kept at over 5 mTorr, near stoichiometric films were obtained that were not dependent on electron beam current.

Figure 4:
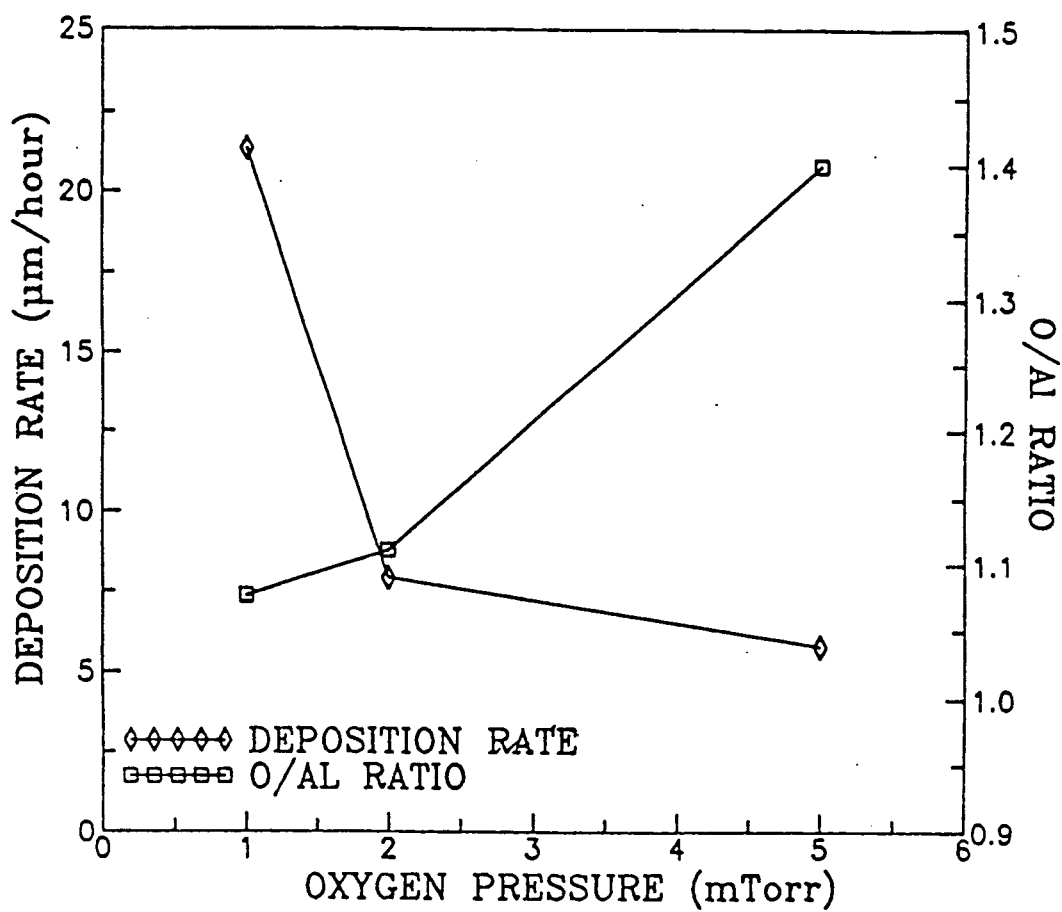
FIG. 4 is a graph of test results showing the relationship between oxygen pressure and deposition rates.

Dark brown colored films which indicate excess aluminum in the films were obtained at 1 mTorr whereas clear and featureless films were obtained at 5 mTorr. The color of the film prepared at 2 mTorr was light brown. The ratio of oxygen to aluminum is also shown in FIG. 4 for the various films which were deposited. The oxygen to aluminum ratio increased as the oxygen pressure increased. Aluminum rich films were formed at lower oxygen pressure due to an insufficiency of oxygen species at the substrate. The number of oxygen species increased with oxygen pressure, thereby producing near stoichiometric films at higher oxygen pressure. The composition of the films obtained at 5 mTorr was 42 atomic % aluminum and 58 atomic % oxygen.

X-ray diffraction patterns of all the films showed a broad halo at near 22° indicating an amorphous structure. This broad halo shifted to a higher scattering angle as the aluminum content increased. This is believed to be due to the change in the chemical short range order of the films. The nearest neighbor distances may change resulting in change in the microscopic density of the film as the composition of the film varies.

A sample which initially exhibited the amorphous phase was heat-treated at 1200° C. in an atmosphere of argon gas for two hours. Several X-ray diffraction peaks appeared after annealing, which were indexed as $\alpha$-$Al_2O_3$ which has a corundum structure, except for one peak at near 65°. The peak at near 65° was indexed as $\theta$-$Al_2O_3$. According to McArdle, et al. (J.L. McArdle and G.L. Messing, Advanced Ceramics Materials, 3(4) (1988) 387), $\theta$-$Al_2O_3$ transforms to $\alpha$-$Al_2O_3$ at about 1200° C. X-ray diffraction showed that the transformation from $\theta$ phase to $\alpha$ phase had not been completed at 1200° C. for two hours.

The refractive index was measured for the various films. The refractive index was found to decrease with increases in oxygen partial pressure. The observed variation in refractive index with oxygen pressure is believed to be due to variations in the stoichiometry of the film. For a given electron beam current and radio frequency excitation power, the oxygen to aluminum ratio decreased as the oxygen partial pressure decreased, thereby resulting in aluminum rich films. As the oxygen pressure was decreased, values for refractive index approached a constant value of about 1.5 which is close to the refractive index of the stoichiometric $Al_2O_3$ film. The lowest value observed for the deposited films was 1.47. This low refractive index is believed to be due to the lower density of the films resulting from the very high deposition rate. The index of refraction of the film could be increased by biasing and/or heating the substrate during deposition.

In conducting subsequent ARE deposition, the above system can be set up and various parameters, such as chamber pressure, oxygen pressure and electron beam current, established to achieve a ratio of metal surface area to metal oxide surface area in order to provide a desired preselected deposition rate and film quality. Further, these same parameters can be monitored and varied to continually maintain the predetermined ratio of relative surface areas at a given value to provide deposition of the desired film at the desired rate.

EXAMPLE 2

This example is carried out in the same manner as Example 1 except that the substrate is heated to a temperature above 300° C. The heating of the substrate to temperatures above 300° C. allows the deposition rate to be increased up to about 12 μm/hour without adversely affecting the deposited film quality. The ratio of metal surface area to metal oxide surface area on the aluminum ingot is maintained at approximately the same levels as in Example 1 to achieve desired film quality and characteristics.

EXAMPLE 3

Several aluminum oxide films were deposited at 5 mTorr oxygen pressure in accordance with Example 1. The electron beam current was varied between 300 mA and 700 mA over a two-hour period. The deposition rates increased from 2 to 12 μm/hour as the current was increased. All of the films were clear and colorless regardless of the electron beam current.

EXAMPLE 4

This example is carried out in the same manner as Example 1 except that the substrate is kept a room temperature.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A process for depositing metal oxide films onto a substrate, said method comprising the step of:
   supporting a substrate in a vacuum chamber having a given chamber pressure;
   providing a metal target material in said vacuum chamber, said metal target having an exposed surface displaced away from said substrate, said exposed surface having a surface area;
   exposing said metal target to a sufficient amount of energy to form a molten metal pool from which metal is evaporated to produce metal vapor in a zone located between said substrate and said metal target;
   introducing an oxygen-containing gas into said zone wherein said gas mixes with said metal vapor to form a mixture of metal vapor and oxygen-containing gas and wherein oxygen from said oxygen-containing gas reacts with said metal target material to form one or more oxides of said metal on the surface of said metal target, said metal oxides forming a layer which covers a portion of said metal target surface area which defines a metal oxide surface area, and wherein said metal pool covers a portion of said metal target surface area which defines a metal surface area;
   energizing the mixture of metal vapor and oxygen-containing gas in said zone with sufficient energy to form a plasma from which metal oxide is deposited onto said substrate; and
   controlling the amount of oxygen introduced into said zone to achieve a preselected ratio of said metal surface area to said metal oxide surface area.

2. A process for depositing metal oxide films onto a substrate according to claim 1 wherein the mixture of metal vapor and oxygen-containing gas is energized with a direct electric current, radio frequency radiation or ECR.

3. A process for depositing metal oxide films onto a substrate according to claim 1 wherein said metal vapor is evaporated by applying an electron beam to said metal target material.

4. A process for depositing metal oxide films according to claim 1 wherein said metal oxide is selected from the group consisting of aluminum oxide, titanium oxide, yttrium oxide, zirconium oxide, tantalum oxide, vanadium oxide, tungsten oxide, niobium oxide and ruthenium oxide.

5. A process for depositing metal oxide films according to claim 4 wherein said metal oxide is aluminum oxide.

6. A process for depositing metal oxide films according to claim 5 wherein the ratio of said metal surface area to said metal oxide surface area is about 2:3.

7. A process for depositing metal oxide films according to claim 5 wherein the partial pressure of oxygen in said vacuum system is between about 1 mTorr to 5 mTorr.

8. A process for depositing metal oxide films according to claim 5 wherein the temperature of said substrate is maintained at a temperature of between about room temperature and 1000° C.

9. A process for depositing metal oxide films according to claim 1 wherein said substrate is selected from the group consisting of glass, stainless steel, molybdenum, quartz, silicon and sapphire.

10. A process for depositing metal oxide according to claim 1 including the additional step of controlling the chamber pressure to achieve said preselected ratio of said metal surface area to said metal oxide surface area.

11. In a process for depositing a metal oxide film onto a substrate wherein the substrate is supported in a vacuum chamber having a given chamber pressure, and a metal target material is provided in the vacuum chamber, said metal target having an exposed surface displaced away from said substrate, said exposed surface having a surface area and wherein the metal target is exposed to a sufficient amount of energy to form a molten metal pool from which metal is evaporated to produce metal vapor in a zone located between said substrate and said metal target, and wherein an oxygen containing gas is introduced into said zone to form a mixture of oxygen containing gas and said metal vapor and wherein oxygen from said oxygen-containing gas reacts with said metal target material to form one or more oxides of said metal on the surface of said metal target, said metal oxides forming a layer which covers a portion of said metal target surface area which defines a metal oxide surface area, and wherein said metal pool covers a portion of said metal target surface area which defines a metal surface area, said process including the further step of energizing the mixture of metal vapor and oxygen-containing gas in said zone with sufficient energy to form a plasma from which metal oxide is deposited onto said substrate, the improvement comprising:

controlling the amount of oxygen introduced into said zone to achieve a preselected ratio of said metal surface area to said metal oxide surface area.

12. An improved process for depositing metal oxide films onto a substrate according to claim 11 including the additional step of controlling the chamber pressure to achieve said preselected ratio of said metal surface area to said metal oxide surface area.

13. An improved process for depositing metal oxide films onto a substrate according to claim 11 wherein the mixture of metal vapor and oxygen-containing gas is energized with a direct electric current, radio frequency radiation or ECR.

14. An improved process for depositing metal oxide films onto a substrate according to claim 11 wherein said metal vapor is evaporated by applying an electron beam to said metal target material.

15. An improved process for depositing metal oxide films according to claim 11 wherein said metal oxide is selected from the group consisting of aluminum oxide, titanium oxide, yttrium oxide, zirconium oxide, tantalum oxide, vanadium oxide, tungsten oxide, niobium and ruthenium oxide.

16. An improved process for depositing metal oxide films according to claim 15 wherein said metal oxide is aluminum oxide.

17. An improved process for depositing metal oxide films according to claim 16 wherein the ratio of said metal surface area to said metal oxide surface area is about 2:3.

18. An improved process for depositing metal oxide films according to claim 16 wherein the partial pressure of oxygen in said vacuum system is between about 1 mTorr to 5 mTorr.

19. An improved process for depositing metal oxide films according to claim 16 wherein the temperature of said substrate is maintained at a temperature of between about room temperature and 1000° C.

20. An improved process for depositing metal oxide films according to claim 11 wherein said substrate is selected from the group consisting of glass, stainless steel, molybdenum, quartz, silicon and sapphire.

* * * * *